United States Patent
Chang

(10) Patent No.: US 10,680,642 B2
(45) Date of Patent: Jun. 9, 2020

(54) DATA PROCESSING SYSTEM AND IMAGE PROCESSING CIRCUIT

(71) Applicant: Realtek Semiconductor Corp., HsinChu (TW)

(72) Inventor: Cheng-Hsin Chang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/407,157

(22) Filed: May 8, 2019

(65) Prior Publication Data

US 2020/0036388 A1    Jan. 30, 2020

Related U.S. Application Data

(60) Provisional application No. 62/711,593, filed on Jul. 29, 2018.

(51) Int. Cl.
| | | |
|---|---|---|
| *H03M 7/30* | (2006.01) | |
| *G06T 1/60* | (2006.01) | |
| *G06T 1/20* | (2006.01) | |
| *H03M 13/03* | (2006.01) | |

(52) U.S. Cl.
CPC ............. *H03M 7/30* (2013.01); *G06T 1/20* (2013.01); *G06T 1/60* (2013.01); *H03M 13/03* (2013.01)

(58) Field of Classification Search
CPC ........... H03M 7/30; H03M 13/03; G06T 1/20; G06T 1/60
USPC ...................................................... 341/50–70
See application file for complete search history.

(56) References Cited

U.S. PATENT DOCUMENTS

| | | | |
|---|---|---|---|
| 5,940,592 A | 8/1999 | Ioki | |
| 8,213,036 B2* | 7/2012 | Ishii | H04N 1/00355 358/1.13 |
| 8,972,610 B2* | 3/2015 | Chang | G06F 13/385 709/250 |
| 2005/0021587 A1* | 1/2005 | Takano | H04N 1/00917 709/200 |
| 2012/0174171 A1* | 7/2012 | Bouchard | H04N 21/25858 725/100 |
| 2013/0298215 A1* | 11/2013 | Kuznetsov | H04L 9/3263 726/8 |
| 2014/0365775 A1* | 12/2014 | Yavuz | H04L 9/3247 713/171 |
| 2016/0234655 A1* | 8/2016 | Meiri | H04L 1/1628 |
| 2018/0076958 A1* | 3/2018 | Narimoto | H04L 9/0819 |

FOREIGN PATENT DOCUMENTS

JP    H04-278656 A    10/1992

\* cited by examiner

*Primary Examiner* — Lam T Mai
(74) *Attorney, Agent, or Firm* — Winston Hsu

(57) ABSTRACT

A data processing system comprising a decompression circuit, configured to decompress compressed data to generate decompressed data. The decompression circuit comprises: a request transmitting terminal, configured to transmit a data receiving request indicating the decompressed data to be received; a valid information transmitting terminal, configured to transmit valid information indicating which part of the decompressed data is valid; and a data transmitting terminal, configured to transmit the decompressed data. An image processing circuit corresponds to the decompression circuit is also disclosed.

13 Claims, 4 Drawing Sheets

DATA PROCESSING SYSTEM AND IMAGE PROCESSING CIRCUIT

CROSS REFERENCE TO RELATED APPLICATIONS

This application claims the benefit of U.S. Provisional Application No. 62/711,593, filed on 2018, Jul. 29, the contents of which are incorporated herein by reference.

BACKGROUND OF THE INVENTION

1. Field of the Invention

The present invention relates to a data processing system and an image processing circuit, and particularly relates to a data processing system and an image processing circuit which can save cost and the size of the system, and can reduce the required bandwidth as well.

2. Description of the Prior Art

An image processing circuit such as a GPU (graphic processing unit) is always included in an electronic device to process image data. However, the image processing circuit needs to read decompressed image data from a memory system rather than directly receives from the decompression circuit, since the image processing circuit always could not match the operation of the decompression circuit. However, such structure increases the size and cost of the whole system. Besides, additional bandwidth is required since the decompressed data needs to be firstly stored to the memory system and then read out by the image processing circuit.

SUMMARY OF THE INVENTION

One objective of the present invention is to provide a data processing system which needs a smaller size, less bandwidth and can save cost.

One embodiment of the present invention discloses a data processing system comprising a decompression circuit, configured to decompress compressed data to generate decompressed data. The decompression circuit comprises: a request transmitting terminal, configured to transmit a data receiving request indicating the decompressed data to be received; a valid information transmitting terminal, configured to transmit valid information indicating which part of the decompressed data is valid; and a data transmitting terminal, configured to transmit the decompressed data.

The above-mentioned data processing system further comprises: an image processing circuit comprising: a request receiving terminal, coupled to the request transmitting terminal, configured to receive the data receiving request; a valid information receiving terminal, coupled to the valid information transmitting terminal, configured to receive the valid information; and a data receiving terminal, coupled to the data transmitting terminal, configured to receive the decompressed data.

In view of above-mentioned embodiments, the decompressed data can be directly transmitted from the decompression circuit to image processing circuit without being buffered to a memory system first, thus the cost and the size of the system can be decreased. Further, the bandwidth for transmitting the decompressed data to the memory system and for reading the decompressed data from the memory system can be saved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
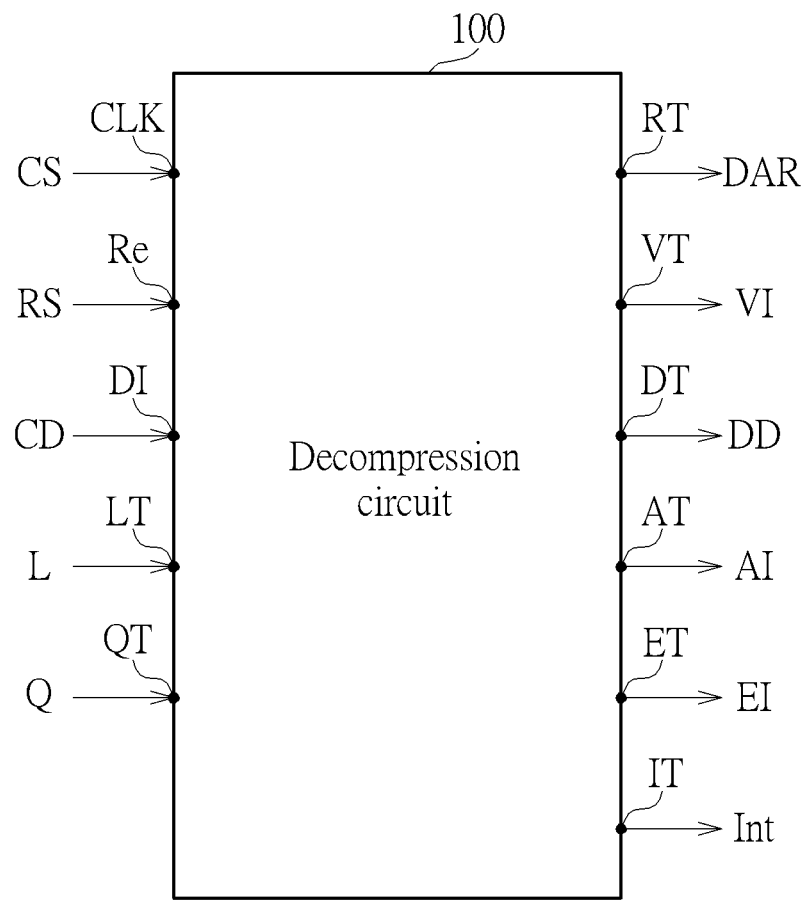
FIG. 1 is a schematic diagram illustrating a decompression circuit according to one embodiment of the present invention.

FIG. 1 is a schematic diagram illustrating a decompression circuit 100 according to one embodiment of the present invention. As illustrated in FIG. 1, the decompression circuit 100 comprises a request transmitting terminal RT, a valid information transmitting terminal VT, a data transmitting terminal DT, an accomplishing information transmitting terminal AT, an error information transmitting terminal ET and an interrupt transmitting terminal IT. In one embodiment, the decompression circuit 100 is an IC (integrated circuit) and the above-mentioned terminals are pins, but not limited.

The request transmitting terminal RT is configured to transmit a data receiving request DAR indicating some decompressed data DD to be received. Thereby the circuit receiving the data receiving request DAR can know some decompressed data DD needs to be received and correspondingly prepare the receiving operation. The valid information transmitting terminal VT is configured to transmit valid information VI indicating which part of the decompressed data DD is valid. Thereby the circuit receiving the decompressed data DD can avoid receiving useless data. The valid information VI can be, for example, information indicating which bits of the decompressed data DD are valid and the circuit receiving the decompressed data DD correspondingly ignores the invalid data. The data transmitting terminal DT is configured to transmit the decompressed data DD.

The accomplishing information transmitting terminal AT is configured to transmit accomplishing information AI indicating whether all the decompressed data DD corresponding to the request have been transmitted or not. Thereby the circuit receiving the decompressed data DD can know the decompressed data DD corresponding to a specific data receiving request has been transmitted. For example, the data receiving request A corresponds to DATA 1-10, and the data receiving request B corresponds to DATA 11-20. Therefore, if the decompression circuit 100 transmits the data receiving request A, the decompression circuit 100 also transmits the accomplishing information AI to inform the circuit receiving the decompressed data DD that the decompressed data corresponding to the data receiving request A has been transmitted.

The error information transmitting terminal ET is configured to transmit error information EI indicating errors of the decompressed data DD. For example, the error information EI can indicate which bits of the decompressed data DD have error, thus the circuit receiving the decompressed data DD can ignore or repair the error data. The interrupt transmitting terminal IT is configured to transmit an interrupt Int to control the circuit receiving the interrupt Int. For example, the interrupt Int can interrupt some operations of the circuit receiving the interrupt Int, such that the decompressed data DD can be successfully transmitted and received.

It will be appreciated the decompression circuit 100 according to the present invention is not limited to comprise all above terminals. For example, in one embodiment, the decompression circuit 100 only comprises the request transmitting terminal RT, the valid information transmitting terminal VT, and the data transmitting terminal DT. Further, in one embodiment, at least one of the accomplishing information AI and the error information EI can be combined to the decompressed data DD.

Please refer to FIG. 1 again, the decompression circuit 100 can further comprise other terminals besides the above-mentioned terminals. As illustrated in FIG. 1, the decompression circuit 100 comprises a clock terminal CLK, a reset terminal Re, a data input terminal DI, a length terminal LT and a Quantization terminal QT. The clock terminal CLK is configured to receive a clock signal CS based on which the decompression circuit 100 operates. The reset terminal Re is configured to receive a reset signal RS which can reset the decompression circuit 100. The data input terminal DI is configured to receive compressed data CD. The length terminal LT is configured to receive the length information L indicating a length of the compressed data CD. The Quantization terminal QT can receive a quantization parameter Q indicating the compression ratio of the compressed data CD.

The above-mentioned decompression circuit 100 can be coupled to an image processing circuit, which can process image data. Please note the image data can be graphic data which comprises a single image or video data which comprises a plurality of continuous images. In such case, the above-mentioned decompressed data DD can be decompressed graphic data or decompressed video data.

Figure 2:
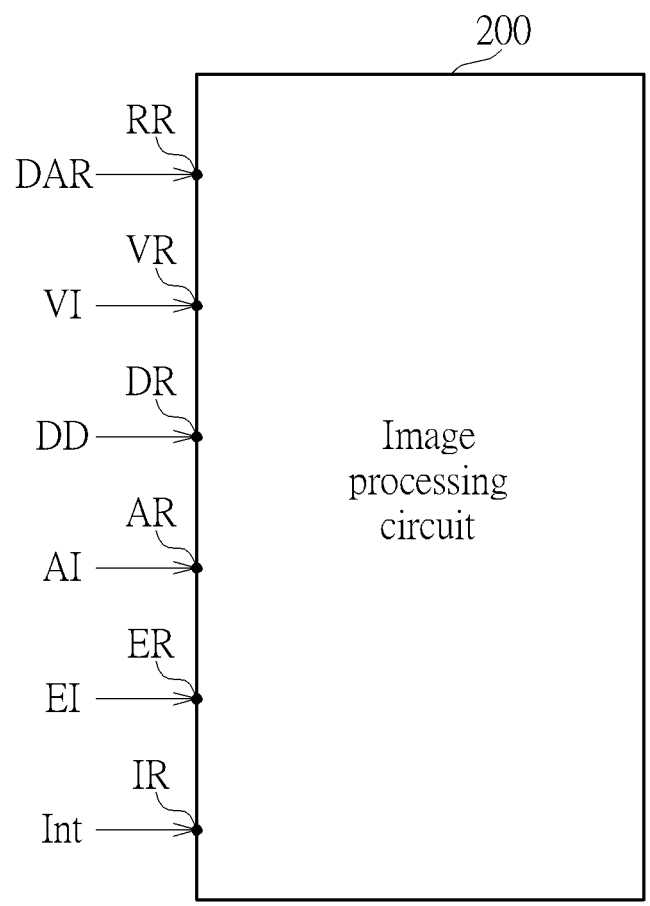
FIG. 2 is a schematic diagram illustrating an image processing circuit according to one embodiment of the present invention.

FIG. 2 is a schematic diagram illustrating an image processing circuit 200 according to one embodiment of the present invention, which can be coupled to the decompression circuit 100 illustrated in FIG. 1. As illustrated in FIG. 2, the image processing circuit 200 comprises a request receiving terminal RR receiving the data receiving request DAR, a valid information receiving terminal VR receiving the valid information VI, a data receiving terminal DR receiving the decompressed data DD, an accomplishing information receiving terminal AR receiving the accomplishing information AI, an error information receiving terminal ER receiving the error information EI and an interrupt receiving terminal IR receiving the interrupt Int. The image processing circuit 200 can process image data which can be above-mentioned graphic data or video data.

Figure 3:
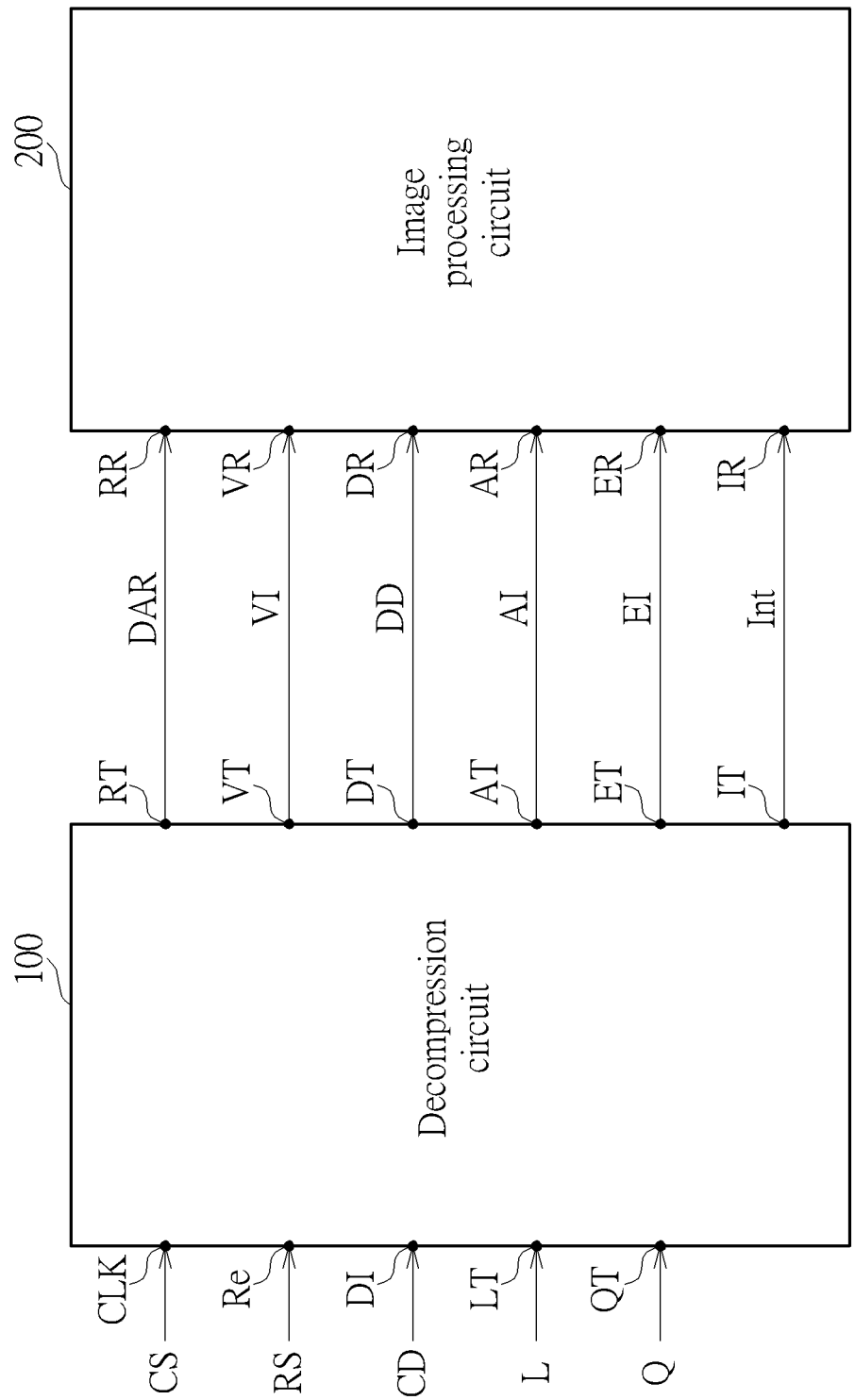
FIG. 3 is a schematic diagram illustrating a data processing system according to one embodiment of the present invention.

FIG. 3 is a schematic diagram illustrating a data processing system 300 comprising the image processing circuit 200 and the decompression circuit 100, according to one embodiment of the present invention. As illustrated in FIG. 3, the request transmitting terminal RT, the valid information transmitting terminal VT, the data transmitting terminal DT, the accomplishing information transmitting terminal AT, the error information transmitting terminal ET and the interrupt transmitting terminal IT of the decompression circuit 100 are respectively coupled to the request receiving terminal RR, the valid information receiving terminal VR, the data receiving terminal DR, the accomplishing information receiving terminal AR, the error information receiving terminal ER and the interrupt receiving terminal IR of the image processing circuit 200. Therefore, the decompressed data DD generated by the decompression circuit 100 can be directly transmitted to the image processing circuit 200, without being buffered to a memory system first. However, please note that the above-mentioned decompression circuit 100 and the image processing circuit 200 are not limited to be combined to each other. The above-mentioned decompression circuit 100 and the image processing circuit 200 can be independently applied to any kind of data processing system or image processing system. In such case, the data received by the image processing circuit 200 can be any kind of input data rather than limited to compressed data. For example, the image processing circuit 200 can receive decompressed data from decompression circuit 100 or originally supported compressed data or non-compressed data.

In one embodiment, the image processing circuit 200 is configured to transform the decompressed data DD and merge the decompressed data DD to generate combined graphic data or combined video data, such as a panorama graphic or a panorama video. The required bandwidth can also be reduced in this embodiment.

In one embodiment, a transmitting interface can be provided between the decompression circuit 100 and the image processing circuit 200 (not illustrated in FIG. 3). The transmitting interface can be any kind of transmitting interface. For example, the transmitting interface can be an AXI (Advanced extensible Interface) bus. In such case, the transmitting interface can comprise terminals respectively coupled to the terminals of the decompression circuit 100 and the image processing circuit 200. The transmitting interface can be independent from the decompression circuit 100 and the image processing circuit 200, or integrated to anyone of the decompression circuit 100 and the image processing circuit 200.

Figure 4:
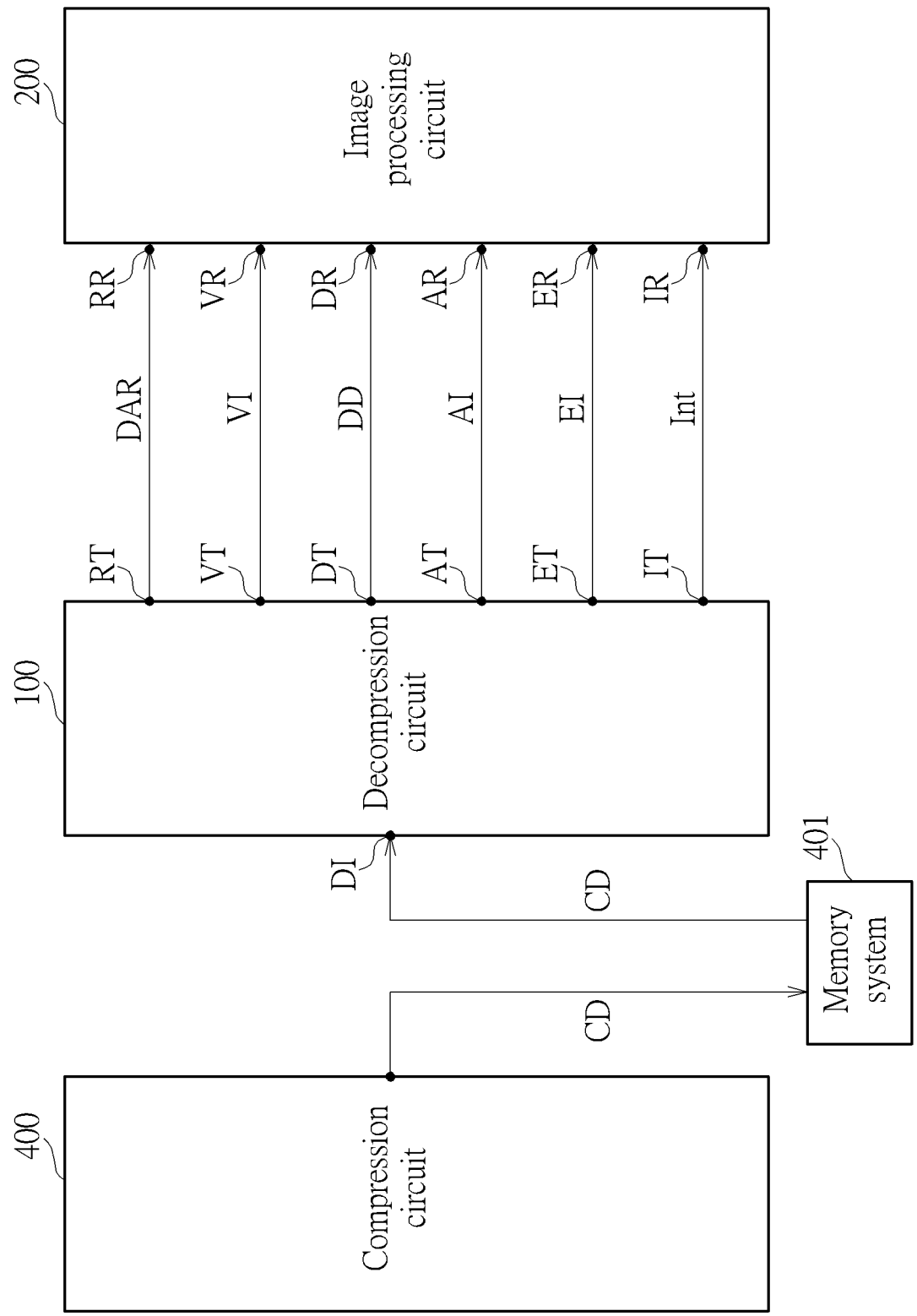
FIG. 4 is a schematic diagram illustrating a data processing system comprising according to another embodiment of the present invention.

FIG. 4 is a schematic diagram illustrating a data processing system 400 according to another embodiment of the present invention, which comprises the decompression circuit 100, the image processing circuit 200, and further comprises a compression circuit 400 and a memory system 401. Please note, for the convenience of understanding, only part of components of the decompression circuit 100 are illustrated.

As illustrated in FIG. 4, the compression circuit 400 is configured to generate the compressed data CD. If the decompressed data DD is image data, the compressed data CD is also image data. In such case, the compression circuit 400 can compress image data from any image source, such as a video decoder or a HDMI interface to generate the compressed data CD. The memory system 401 is coupled to the compression circuit 400 and the decompression circuit 100, configured to buffer the compressed data CD before the compressed data CD is transmitted to the decompression circuit 100. The decompression circuit 100 reads the compressed data CD buffered in the memory system 401 to generate the decompressed data DD. The memory system 401 can be, for example, a memory device such as a RAM, but not limited.

In view of above-mentioned embodiments, the decompressed data can be directly transmitted from the decompression circuit to image processing circuit without being buffered to a memory system first, thus the cost and the size of the system can be decreased. Further, the bandwidth for transmitting the decompressed data to the memory system and for reading the decompressed data from the memory system can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data processing system, comprising:
a decompression circuit, configured to decompress compressed data to generate decompressed data, comprising:
a request transmitting terminal, configured to transmit a data receiving request indicating the decompressed data to be received;
a valid information transmitting terminal, configured to transmit valid information indicating which part of the decompressed data is valid; and
a data transmitting terminal, configured to transmit the decompressed data;
a compression circuit, configured to generate the compressed data; and
a memory system, coupled to the compression circuit and the decompression circuit, configured to store the compressed data;
wherein the decompression circuit read the compressed data buffered in the memory system to generate the decompressed data.

2. The data processing system of claim 1, further comprising:
an accomplishing information transmitting terminal, configured to transmit accomplishing information indicating whether all the decompressed data corresponding to the request have been transmitted or not.

3. The data processing system of claim 1, further comprising:
an error information transmitting terminal, configured to transmit error information indicating errors of the decompressed data.

4. The data processing system of claim 1, further comprising:
an interrupt transmitting terminal, configured to transmit an interrupt to control a circuit receiving the decompressed data.

5. The data processing system of claim 1, further comprising:
an image processing circuit, comprising:
a request receiving terminal, coupled to the request transmitting terminal, configured to receive the data receiving request;
a valid information receiving terminal, coupled to the valid information transmitting terminal, configured to receive the valid information; and
a data receiving terminal, coupled to the data transmitting terminal, configured to receive the decompressed data.

6. The data processing system of claim 5, wherein the image processing circuit is configured to transform the decompressed data and merge the decompressed data to generate combined graphic data or combined video data.

7. The data processing system of claim 5, further comprising:
an AXI bus, coupled to the request transmitting terminal, the valid information transmitting terminal and the data transmitting terminal of the decompression circuit, and the request receiving terminal, the valid information receiving terminal and the data receiving terminal of the image processing circuit.

8. The data processing system of claim 1, wherein the decompressed data is decompressed graphic data or decompressed video data.

9. An image processing circuit, comprising:
a request receiving terminal, configured to receive a data receiving request indicating input data to be received;
a valid information receiving terminal, configured to receive valid information indicating which part of the input data is valid; and
a data receiving terminal, configured to receive the input data;
wherein the input data is decompressed graphic data directly from a decompress circuit or decompressed video data directly from the decompress circuit;
wherein the image processing circuit is configured to transform the input data and merge the input data to generate combined graphic data or combined video data.

10. The image processing circuit of claim 9, further comprising:
an accomplishing information receiving terminal, configured to receive accomplishing information indicating whether all the input data corresponding to the request have been transmitted or not.

11. The image processing circuit of claim 9, further comprising:
an error information receiving terminal, configured to receive error information indicating errors of the input data.

12. The image processing circuit of claim 9, further comprising:
an interrupt receiving terminal, configured to receive an interrupt;
wherein the image processing circuit operates corresponding to the interrupt.

13. The image processing circuit of claim 9, further comprising:
an AXI bus, coupled to the request receiving terminal, the valid information receiving terminal and the data receiving terminal.

* * * * *